United States Patent
Kawase et al.

(10) Patent No.: US 9,474,194 B2
(45) Date of Patent: Oct. 18, 2016

(54) ELECTRONIC COMPONENT MOUNTING SYSTEM

(75) Inventors: Takeyuki Kawase, Yamanashi (JP); Kazuhiko Itose, Yamanashi (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 353 days.

(21) Appl. No.: 13/992,060

(22) PCT Filed: Dec. 7, 2011

(86) PCT No.: PCT/JP2011/006852
§ 371 (c)(1),
(2), (4) Date: Jun. 6, 2013

(87) PCT Pub. No.: WO2012/077341
PCT Pub. Date: Jun. 14, 2012

(65) Prior Publication Data
US 2013/0247368 A1 Sep. 26, 2013

(30) Foreign Application Priority Data
Dec. 9, 2010 (JP) .................................. 2010-274300

(51) Int. Cl.
*H05K 13/04* (2006.01)
*H05K 13/08* (2006.01)

(52) U.S. Cl.
CPC .......... *H05K 13/04* (2013.01); *H05K 13/0452* (2013.01); *H05K 13/08* (2013.01); *Y10T 29/4913* (2015.01); *Y10T 29/53174* (2015.01)

(58) Field of Classification Search
CPC ... H01L 25/00; H01L 25/03; H01L 25/0655; H01L 25/075; H05K 13/04; H05K 13/0452; H05K 13/08; Y10T 29/4913; Y10T 29/53174
See application file for complete search history.

(56) References Cited

U.S. PATENT DOCUMENTS 4,725,182 A * 2/1988 Sakamoto .......... H05K 13/0061
198/465.1
6,408,505 B1 * 6/2002 Hata et al. ...................... 29/740
(Continued)

FOREIGN PATENT DOCUMENTS

JP 2006-190818 A 7/2006
JP 2009-239257 A 10/2009
(Continued)

OTHER PUBLICATIONS

International Search Report for PCT/JP2011/006852 dated Jan. 31, 2012.

*Primary Examiner* — Carl Arbes
(74) *Attorney, Agent, or Firm* — Pearne & Gordon LLP

(57) ABSTRACT

An electronic component mounting system configured by joining together a plurality of electronic component mounting apparatuses (M2) to (M5*), each of which has a first mounting lane (L1) and a second mounting lane (L2), is configured so as to be able to carry out any one selected from a first operation mode of letting one operation performance mechanism carry out operation performance while taking as a target only a substrate of a substrate conveyance mechanism corresponding to the operation performance mechanism and a second operation mode in which one operation performance mechanism can carry out operation performance while taking as targets all of a plurality of substrates conveyed by a plurality of substrate conveyance mechanisms, and only the two electronic component mounting apparatuses (M5*) each of which is equipped with a tray feeder (30) is brought into the second operation mode.

2 Claims, 11 Drawing Sheets

(56) References Cited

U.S. PATENT DOCUMENTS

| | | | |
|---|---|---|---|
| 6,845,645 B2* | 1/2005 | Bartrom et al. | 72/15.5 |
| 6,944,943 B2* | 9/2005 | Cho | H05K 13/046 198/468.01 |
| 7,003,872 B2* | 2/2006 | Mimura et al. | 29/832 |
| 7,036,213 B2* | 5/2006 | Kabeshita | H05K 13/0061 29/740 |
| 7,200,922 B2* | 4/2007 | Kabeshita et al. | 29/740 |
| 7,895,736 B2* | 3/2011 | Uchino et al. | 29/740 |
| 7,954,233 B2* | 6/2011 | Maenishi | 29/832 |
| 8,079,140 B2* | 12/2011 | Maenishi | 29/832 |
| 2002/0062555 A1* | 5/2002 | Hwang | H05K 13/0061 29/832 |
| 2005/0125998 A1* | 6/2005 | Mimura et al. | 29/832 |
| 2007/0157462 A1* | 7/2007 | Nakamura | 29/832 |
| 2008/0147232 A1 | 6/2008 | Kuribayashi et al. | |
| 2008/0221723 A1* | 9/2008 | Lee | H05K 13/0061 700/112 |
| 2008/0263858 A1* | 10/2008 | Onishi | 29/743 |
| 2011/0197775 A1 | 8/2011 | Nagao | |
| 2011/0232082 A1* | 9/2011 | Kim et al. | 29/740 |

FOREIGN PATENT DOCUMENTS

| | | |
|---|---|---|
| JP | 2009-290133 A | 12/2009 |
| JP | 2010-087448 A | 4/2010 |

* cited by examiner

ELECTRONIC COMPONENT MOUNTING SYSTEM

TECHNICAL FIELD

The invention relates to an electronic component mounting system that manufactures a mounted substrate by mounting electronic components on a substrate and an electronic component mounting method.

BACKGROUND ART

An electronic component mounting system that manufactures a mounted substrate by mounting electronic components on a substrate is constructed by joining a plurality of component mounting apparatuses which subject a substrate printed with solder bonding paste to various operations pertinent to component mounting, such as operations of mounting and inspecting components. An apparatus known as a component mounting apparatus of the kind has two substrate conveyance mechanisms and two operation performance mechanisms which individually correspond to the respective substrate conveyance mechanisms. Adopting such a configuration makes it possible to select one as a production mode from a so-called independent operation mode of letting each of two operation performance mechanisms perform a operation for a substrate held by one corresponding substrate conveyance mechanism and a so-called alternate operation mode letting the two operation performance mechanisms alternately perform respective operations targeted for both substrates held by the two substrate conveyance mechanisms (see; for instance, Patent Document 1). According to the related art described in connection with the patent document, a determination is automatically made on the basis of mount information about a substrate and components as to which one of the production modes is suitable for the substrate during a component mounting operation for mounting electronic components on substrates.

RELATED ART DOCUMENT

Patent Document

Patent Document 1: JP-A-2009-239257

SUMMARY OF THE INVENTION

Problem that the Invention is to Solve

Diversification of a production mode has recently proceeded in the electronic industry, and a flexible electronic component mounting system capable of appropriately selecting one from a variety of mounting operation modes in accordance with a characteristic of a type of a production target has become desired at a production site involving component mounting. To this end, the electronic component mounting system with the foregoing configuration is required to enhance production efficiency of the component mounting system to the extent possible by appropriate combination of the two production modes, or the independent operation mode and the alternate operation mode. However, the related art described in connection with the patent document provides only a disclosure of a determination as to which one of the production modes is suitable for an individual substrate but does not include any disclosure about a specific configuration of an efficient electronic component mounting system. For these reasons, an electronic component mounting system and an electronic component mounting method that are flexible and exhibit superior production efficiency have long been awaited.

Accordingly, the invention aims at providing an electronic component mounting system and an electronic component mounting method that enable selection of one from a variety of mounting operation modes in accordance with a characteristic of a type of a production target and that are flexible and exhibit superior production efficiency.

Means for Solving the Problem

An electronic component mounting system of the present invention is configured by joining a plurality of component mounting apparatuses that perform component mounting operations for mounting electronic components on substrates, wherein each of the component mounting apparatuses has: a first substrate conveyance mechanism and a second substrate conveyance mechanism that convey substrates received from an upstream apparatuses in a substrate conveyance direction and that each has a substrate holding section for positioning and holding the substrate, a first operation performance mechanism and a second operation performance mechanism that are provided in correspondence to the first substrate conveyance mechanism and the second substrate conveyance mechanism and that perform predetermined operation performance while taking the substrates held by the substrate holding sections as targets, a operation control section that controls the first substrate conveyance mechanism, the second substrate conveyance mechanism, the first operation performance mechanism, and the second operation performance mechanism, so as to selectively perform any one selected from two modes of a first operation mode and a second operation mode, the first operation mode letting one operation performance mechanism carry out operation performance while taking as a target only a substrate held by the substrate holding section of a substrate conveyance mechanism corresponding to the operation performance mechanism, the second operation mode in which one operation performance mechanism can carry out operation performance while taking as targets two substrates held by the substrate holding section of the substrate conveyance mechanism and the substrate holding section of the other substrate conveyance mechanism; wherein the electronic component mounting system comprises a mode command section for commanding the operation mode to be selectively carried out in each of the component mounting apparatuses to the respective component mounting apparatuses; at least two of the component mounting apparatuses are electronic component mounting apparatuses that mount on the substrates electronic components picked up from a tray feeder by a mounting head of a component mounting mechanism that serves as the operation performance mechanism; and the mode command section sends the second operation mode as a operation mode to be selectively carried out to at least the two electronic component mounting apparatuses, and one of the tray feeders of at least the two electronic component mounting apparatuses is used in a component mounting operation intended for a substrate held by the substrate holding section of the first substrate conveyance mechanism, and the other tray feeder is used in a component mounting operation intended for a substrate held by the substrate holding section of the second substrate conveyance mechanism.

An electronic component mounting method for mounting electronic components on substrates by means of an electronic component mounting system built by joining a plurality of component mounting apparatuses that perform component mounting operations, wherein each of the component mounting apparatuses has a first substrate conveyance mechanism and a second substrate conveyance mechanism that convey substrates received from an upstream apparatuses in a substrate conveyance direction and that each have a substrate holding section for positioning and holding the substrate, a first operation performance mechanism and a second operation performance mechanism that are provided in correspondence to the first substrate conveyance mechanism and the second substrate conveyance mechanism and that perform predetermined operation performance while taking the substrates held by the substrate holding sections as targets, and a operation control section that controls the first substrate conveyance mechanism, the second substrate conveyance mechanism, the first operation performance mechanism, and the second operation performance mechanism, so as to selectively perform any one selected from two modes of a first operation mode and a second operation mode, the first operation mode letting one operation performance mechanism carry out operation performance while taking as a target only a substrate held by the substrate holding section of a substrate conveyance mechanism corresponding to the operation performance mechanism, and the second operation mode in which one operation performance mechanism can carry out operation performance while taking as targets two substrates held by the substrate holding section of the substrate conveyance mechanism and the substrate holding section of the other substrate conveyance mechanism;

wherein at least two of the component mounting apparatuses are electronic component mounting apparatuses that mount on the substrates electronic components picked up from a tray feeder by a mounting head of a component mounting mechanism that serves as the operation performance mechanism; and wherein the second operation mode is sent as a operation mode to be selectively carried out to at least the two electronic component mounting apparatuses when the component mounting operation is carried out, and one of the tray feeders of at least the two electronic component mounting apparatuses is used in operation performance intended for a substrate held by the substrate holding section of the first substrate conveyance mechanism, and the other tray feeder is used in operation performance intended for a substrate held by the substrate holding section of the second substrate conveyance mechanism.

Advantage of the Invention

According to the invention, an electronic component mounting system built by joining a plurality of electronic component mounting apparatuses is configured so as to be able to selectively carry out processing pertinent to any one of two operation modes; namely, a first operation mode of letting one operation performance mechanism carry out operation performance while taking as a target only a substrate held by the substrate holding section of a substrate conveyance mechanism corresponding to the operation performance mechanism and a second operation mode in which one operation performance mechanism can carry out operation performance while taking as targets all a plurality of substrates held by the substrate holding sections of a plurality of substrate conveyance mechanisms. Further, at least two of the component mounting apparatuses are taken as electronic component mounting apparatus that mount on substrates electronic components picked up from a tray feeder by a mounting head of a component mounting mechanism that serves as a operation performance mechanism. Various appropriate mounting operation mode can thereby be selected in accordance with a characteristic of a type of a production target. Thus, an electronic component mounting system and an electronic component mounting method that exhibit superior flexibility and production efficiency can be materialized.

EMBODIMENT FOR IMPLEMENTING THE INVENTION

An embodiment of the invention is now described by reference to the drawings. First, a configuration of an electronic component mounting system is described by reference to FIG. 1. The electronic component mounting system 1 has a function of manufacturing a mounted substrate on which electronic components are implemented and is constituted by joining a plurality of component mounting apparatuses that subject a substrate, which is fed from an upstream side and is printed with a paste for bonding electronic components, to component mounting operations for mounting electronic components on a substrate. Specifically, an electronic component mounting system 1 is built by linearly inking, in sequence from an upstream side (i.e., a left side of FIG. 1), a coating-inspecting apparatus M1 that is a component mounting apparatus; electronic component mounting apparatuses M2 to M5*, and a mounting-inspecting apparatus M6, along a substrate conveyance direction (a direction X). The apparatuses are connected to the host computer 3 by way of a LAN system 2, and the host computer 3 collectively controls component mounting operations of the respective apparatuses in the electronic component mounting system 1.

Figure 2:
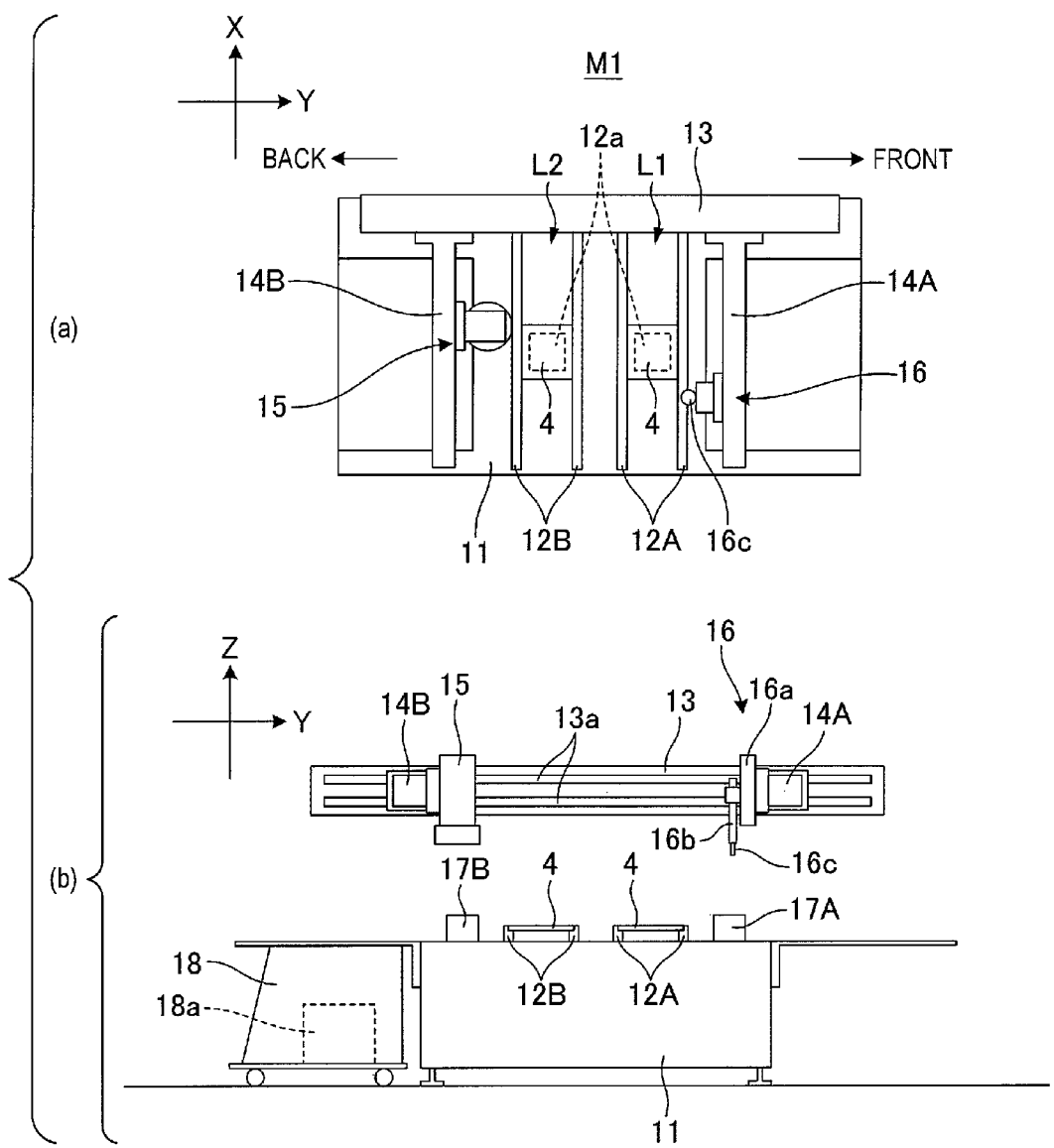
FIG. 2 is view in which (a) and (b) are explanatory views of a configuration of a coating-inspecting apparatus in the electronic component mounting system of the embodiment of the invention.
Figure 4:
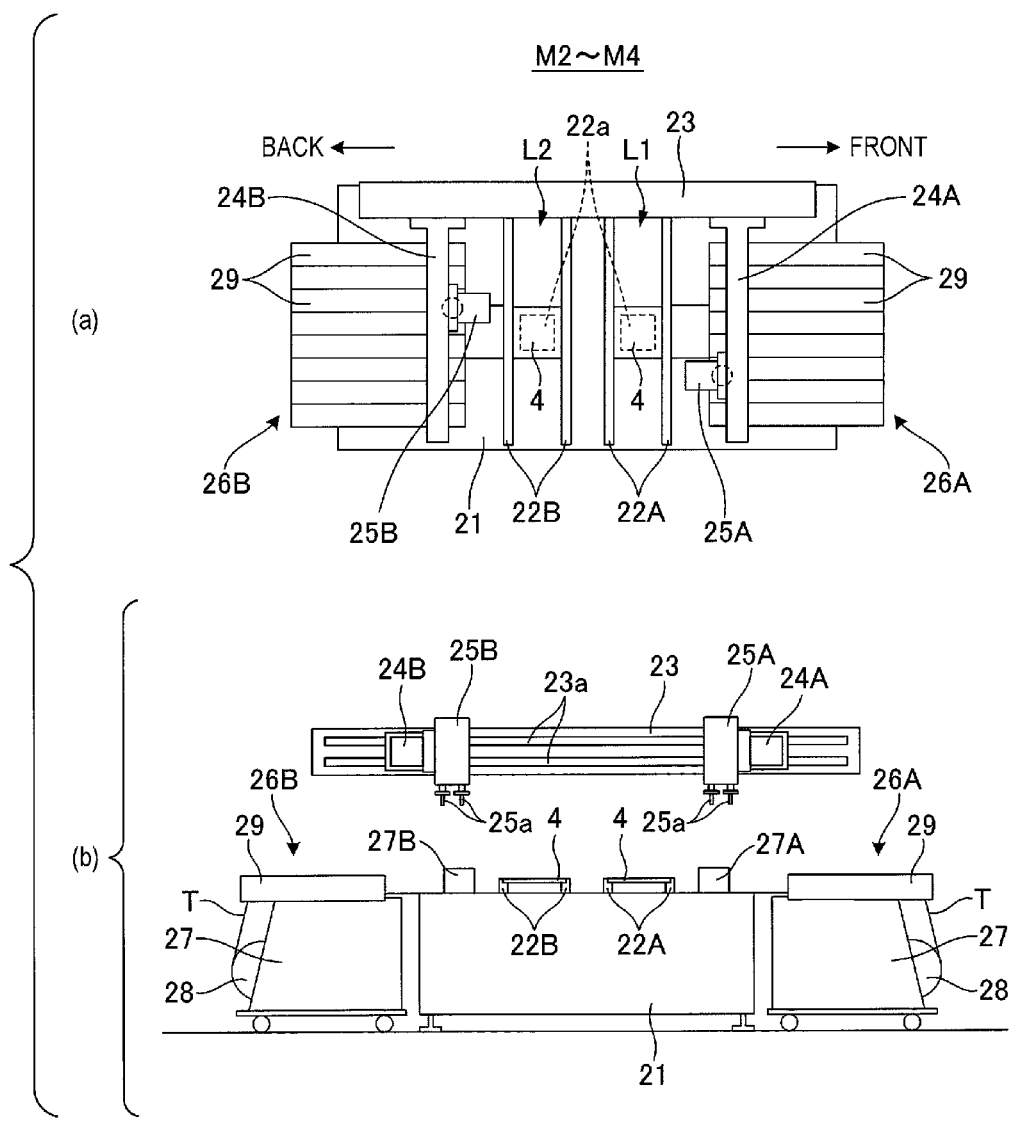
FIG. 4 is view in which (a) and (b) are explanatory views of a configuration of an electronic component mounting apparatus in the electronic component mounting system of the embodiment of the invention.
Figure 5:
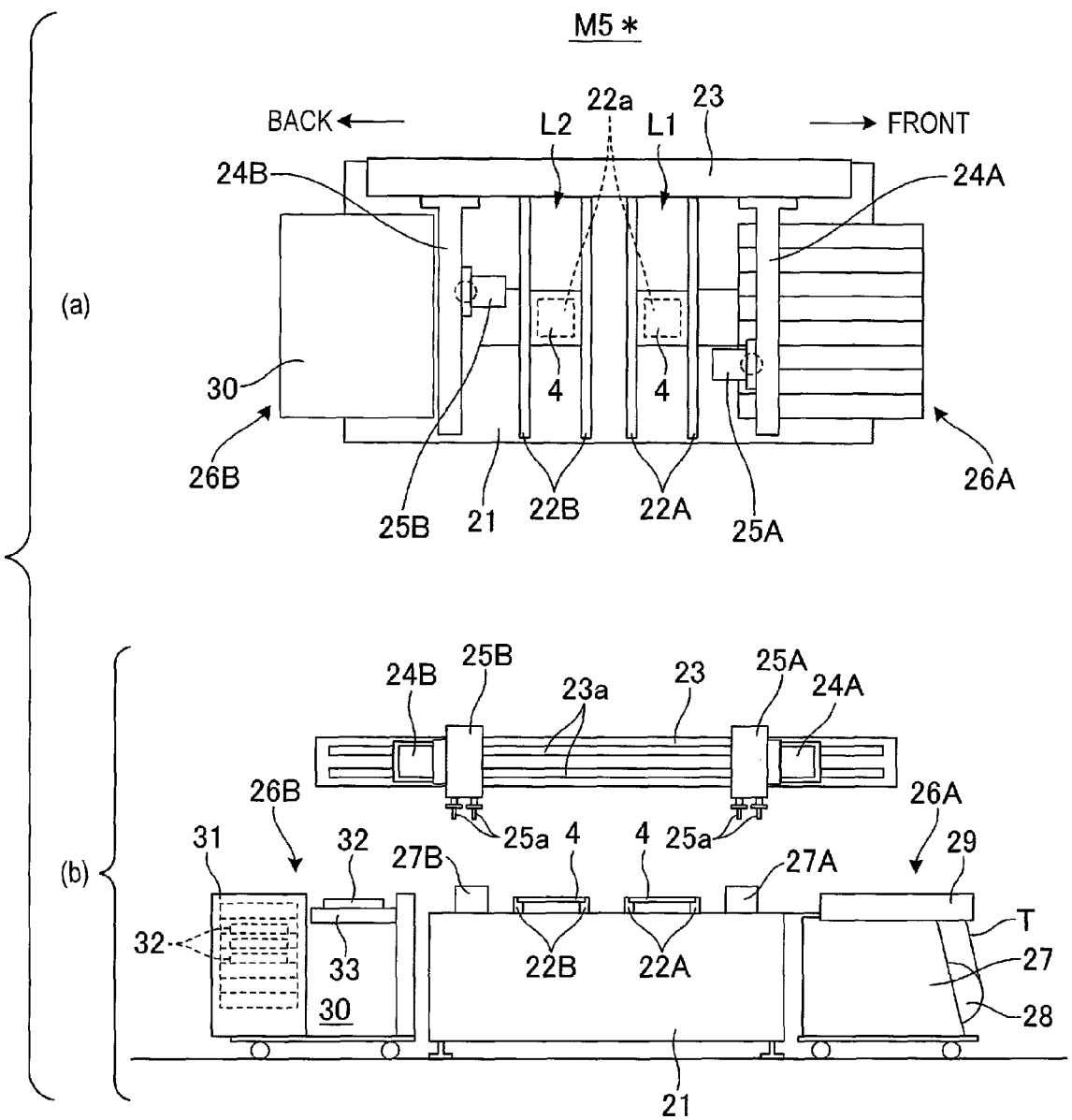
FIG. 5 is view in which (a) and (b) are explanatory views of the configuration of the electronic component mounting apparatus in the electronic component mounting system of the embodiment of the invention.

Each of the coating-inspecting apparatus M1 to the mounting-inspecting apparatus M6 has a plurality of substrate conveyance mechanisms (two mechanisms in the embodiment) that respectively have substrate holding sections (see substrate holding sections 12a, 22a, 42a shown in (a) in FIG. 2, (a) in FIG. 4, (a) in FIG. 5 which each receive substrates 4 (see (a) and (b) in FIG. 2) passed from an upstream apparatus and convey the thus-received substrates in the substrate conveyance direction, subsequently positioning and holding the substrates 4. Each of the electronic component mounting apparatuses M2 to M5* also has a plurality of substrate conveyance mechanisms (two mechanisms in the embodiment) that respectively have substrate holding sections (see substrate holding sections 22a shown in (a) in FIG. 4 and (a) in FIG. 5) which each receive the substrates 4 (see (a) and (b) in FIG. 2) passed from an upstream apparatus and convey the thus-received substrates in the substrate conveyance direction, subsequently positioning and holding the substrates 4. The mounting-inspecting apparatus M6 also has a plurality of substrate conveyance mechanisms (two mechanisms in the embodiment) that respectively have substrate holding sections (see substrate holding sections 42a) which each receive the substrates 4 (see (a) and (b) in FIG. 2) passed from an upstream apparatus and convey the thus-received substrates in the substrate conveyance direction, subsequently positioning and holding the substrates 4. In each of the apparatuses, each of the substrate conveyance mechanisms corresponds to operation performance mechanisms, such as an inspection processing mechanism and a component mounting mechanism. Therefore, in each of the apparatuses, corresponding operation performance mechanisms can simultaneously perform component mounting operations in parallel for the substrates 4 that have been conveyed by the substrate conveyance mechanisms and are positioned and held by the substrate holding sections. Alternatively, one operation performance mechanism can also sequentially take as targets the substrates 4 that are positioned and held by the substrate holding sections of the plurality of substrate conveyance mechanisms.

A substrate conveyance lane made by joining the substrate conveyance mechanisms of the respective apparatuses makes up a mounting lane along which the substrate 4 is subjected to mounting operations while being conveyed, in combination with corresponding operation performance mechanisms. In the electronic component mounting system 1 described in connection with the embodiment, each of the apparatuses has two substrate conveyance mechanisms. Therefore, two individual lanes, or a first mounting lane L1 (a front-side mounting lane) and a second mounting lane L2 (a rear-side mounting lane), are formed. Each of the component mounting apparatuses that make up the electronic component mounting system 1 has a plurality of substrate conveyance mechanisms which convey the substrates 4 received from upstream apparatuses in the substrate conveyance direction and which have the substrate holding sections for positioning and holding the substrates 4, and also has a plurality of operation performance mechanisms which are provided in correspondence with the respective substrate conveyance mechanisms and which carry out predetermined operation performance for the substrates 4 held by the substrate holding sections.

A structure of the apparatuses that make up the electronic component mounting system 1 is hereunder described. A configuration of the coating-inspecting apparatus M1 is first descried by reference to FIG. 2. As shown in (a) in FIG. 2, a first substrate conveyance mechanism 12A that makes up the first mounting lane L1 and a second substrate conveyance mechanism 12B that makes up the second mounting lane L2 are laid at a center of a top surface of a bench 11 in the direction X. The first substrate conveyance mechanism 12A and the second substrate conveyance mechanism 12B convey in the direction X the substrates 4 that have been delivered from an upstream apparatus and that are printed with paste. Each of the first substrate conveyance mechanism 12A and the second substrate conveyance mechanism 12B has the substrate holding section 12a, and the respective substrate holding sections 12a position and hold the thus-conveyed substrates 4 at respective operation positions in the coating-inspecting apparatus M1.

A Y-axis movable table 13 is placed along a direction Y at an end of the top surface of the bench 11 that is downstream in the direction X. The Y-axis movable table 13 is outfitted with a first X-axis movable table 14A and a second X-axis movable table 14B. As shown in (b) in FIG. 2, the first X-axis movable tables 14A and 14B are slidable in the direction Y along guide rails 13a laid on a side surface of the Y-axis movable table 13 and are moved along the direction Y by means of a built-in linear motor mechanism in the Y-axis movable table 13. The first X-axis movable table 14A is outfitted with a coating head 16 as a work head by way of an X-axis movable attachment base, and the second X-axis movable table 14B is outfitted with an inspection head 15 as a work head by way of the X-axis movable attachment base. The coating head 16 is actuated in the direction X by means of the built-in linear motor mechanism of the first X-axis movable table 14A, and the inspection head 15 is actuated in the direction X by the built-in linear motor mechanism of the second X-axis movable table 14B. The Y-axis movable table 13, the first X-axis movable table 14A, and the second X-axis movable table 14B make up a head actuating mechanism for actuating the coating head 16 and the inspection head 15.

The coating head 16 is configured such that a dispenser 16b is held in a vertically movable manner by a vertical base 16a and has a function of squirting a resin adhesive for bonding electronic components from a nozzle 16c attached to a lower portion of the dispenser 16b. The coating head 16 is moved to a position above the substrate 4 that is positioned and held by the substrate holding section 12a of the first substrate conveyance mechanism 12A by a head actuating mechanism and also to a position above the other substrate 4 that is positioned and held by the substrate holding section 12a of the second substrate conveyance mechanism 12B by the head actuating mechanism, whereby arbitrary resin coating points on the substrates 4 can be coated with a resin adhesive.

A sacrificial spray unit 17A to be used along with the coating head 16 is placed beside the first substrate conveyance mechanism 12A. The coating head 16 is moved to a position above the sacrificial spray unit 17A, thereby lowering the dispenser 16b with respect to the sacrificial spray unit 17A. Trial spraying for confirming a squirted state of a resin adhesive, and sacrificial spraying for eliminating an unwanted resin adhesive adhering to the nozzle 16c are performed.

The inspection head 15 has a built-in imaging apparatus for capturing an image of the substrate 4 to be inspected. By the head actuating mechanism, the inspection head 15 is moved to positions above the respective substrates 4 that are positioned and held by the substrate holding section 12a of the first substrate conveyance mechanism 12A and the substrate holding section 12a of the second substrate conveyance mechanism 12B, subsequently capturing images of the respective substrates 4 to be inspected. A carriage 18 attached to the bench 11 sideways has a built-in recognition processing unit 18a. An image captured by the inspection head 15 is subjected to recognition processing by the recognition processing unit 18a, whereby an inspection is performed on predetermined inspection items by means of image recognition. A calibration unit 17B is placed beside the second substrate conveyance mechanism 12B. The inspection head 15 is moved to a position above the calibration unit 17B to capture an image of the calibration unit 17B, whereby an imaging state achieved when the inspection head 15 has captured an image is calibrated.

Operation performance performed by the coating-inspecting apparatus M1 is now described by reference to FIG. 3. In (a) in FIG. 3, the first substrate conveyance mechanism 12A and the second substrate conveyance mechanism 12B hold the substrates 4, respectively. First, the substrate 4 held by the first substrate conveyance mechanism 12A is taken as an inspection target, and the inspection head 15 moves to a position above the substrate 4, where an image of a position of the substrate 4 to be inspected is captured. Next, as shown in (b) in FIG. 3, when the inspection head 15 is retracted from the position above the substrate 4 to be inspected, the coating head 16 is caused to advance toward a position above the substrate 4, and the dispenser 16b is then lowered. Thus, the nozzle 16c coats coating points on a top surface of the substrate 4 with a resin adhesive 19.

Subsequently, after the coating head 16 has been retracted from the position above the substrate 4, the inspection head 15 is again caused to advance to the position above the substrate 4, thereby capturing an image of the substrate 4 coated with the adhesive resin 19. An imaging result is subjected to recognition processing by the recognition processing unit 18a, whereby there is carried out a pre-coating inspection for inspecting a state of the substrate 4 before resin coating and a post-coating inspection for inspecting a state of the substrate 4 after resin coating. Coating and inspection processing can be completed at this time without moving the substrate 4 during the pre-coating inspection, the coating operation, and the post-coating inspection. In this respect, the coating-inspecting apparatus M1 assumes various inspection modes. As shown in (a) to (c) in FIG. 3, in addition to a mode for performing both the pre-coating inspection and the post-coating inspection, another mode for performing either only the pre-coating inspection or the post-coating inspection can also be assumed.

Figure 3:
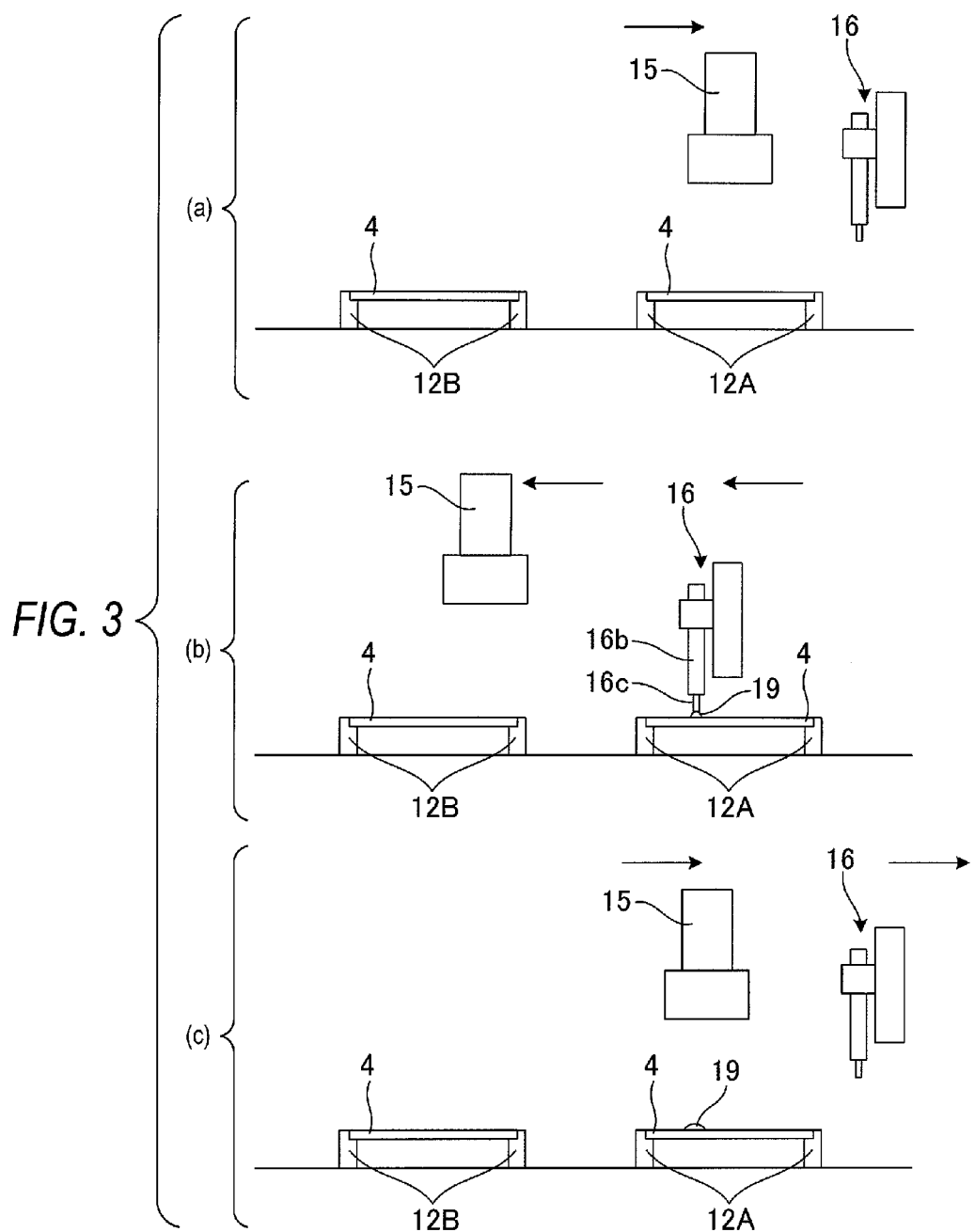
FIG. 3 is view in which (a) to (c) are explanatory views of functions of the coating-inspecting apparatus in the electronic component mounting system of the embodiment of the invention.

The embodiment shown in (a) to (c) in FIG. 3 shows an example of coating operation and inspecting operation that are intended solely for the substrate 4 held by the first substrate conveyance mechanism 12A. However, when the substrates 4 to be inspected are simultaneously held by the first substrate conveyance mechanism 12A and the second substrate conveyance mechanism 12B, respectively, the two substrates 4 are targets of coating operation and inspecting operation. In this case, there is employed an operation pattern that makes it possible to perform coating operation and inspecting operation most efficiently for the two substrates 4.

In the configuration of the coating-inspecting apparatus M1 the Y-axis movable table 13, the first X-axis movable table 14A, and the coating head 16 make up a resin coating mechanism that serves as a operation performance mechanism for performing resin coating operation, which is a component mounting operation, for the plurality of substrates 4 conveyed by the plurality of substrate conveyance mechanisms. Further, the Y-axis movable table 13, the first X-axis movable table 1BA, and the inspection head 15 make up an inspection processing mechanism that serves as a operation performance mechanism for performing a substrate inspection, which is a component mounting operation, for the plurality of substrates conveyed by the plurality of substrate conveyance mechanisms. As above, the resin coating mechanism and the inspection processing mechanism make up the coating-inspecting apparatus M1 in combination with the plurality of substrate conveyance mechanisms, whereby two functions can be compactly incorporated in one apparatus space within the electronic component mounting system 1 outfitted with the plurality of individual mounting lanes.

A configuration of each of the electronic component mounting apparatuses M2 to M4 is now described by reference to FIG. 4. The electronic component mounting apparatuses M2 to M4 have an identical structure. In (a) in FIG. 4, a first substrate conveyance mechanism 22A making up the first mounting lane L1 and a second substrate conveyance mechanism 22B making up the second mounting lane L2 are laid at a center on a top surface of a bench 21 along the direction X. The first substrate conveyance mechanism 22A receives and conveys the substrate 4 that is conveyed by the first substrate conveyance mechanism 12A of the coating-inspecting apparatus M1 after having been coated and inspected. The second substrate conveyance mechanism 22B receives and conveys the substrate 4 that is conveyed by the second substrate conveyance mechanism 12B of the coating-inspecting apparatus M1 after having been coated and inspected. Each of the first substrate conveyance mechanism 22A and the second substrate conveyance mechanism 22B has the substrate holding section 22a, and the substrate holding section 22a positions and holds the conveyed substrate 4 at a operation position on each of the electronic component mounting apparatuses M2 to M4.

A first component feed section 26A and a second component feed section 26B that feed components to be mounted are disposed one on either side of the bench 21. A carriage 27 outfitted with a plurality of tape feeders 29 is placed for each of the first component feed section 26A and the second component feed section 26B. Each of tape feed reels 28 housing in a coiled manner a carrier tape T holding electronic components to be mounted is mounted on the carriage 27 in correspondence to each of the tape feeders 29. Each of the tape feeders 29 performs pitch-feeding of the carrier tape T withdrawn from a corresponding tape feed reel 28, thereby feeding electronic components to a pickup position for the component mounting mechanism to be described below.

A Y-axis movable table 23 is placed along the direction Y at an end of the top surface of the bench 21 that is downstream in the direction X. The Y-axis movable table 23 is outfitted with a first X-axis movable table 24A and a second X-axis movable table 24B. As shown in (b) in FIG. 4, the first X-axis movable table 24A and the second X-axis movable table 24B are slidable in the direction Y along guide rails 23a laid on a side surface of the Y-axis movable table 23 and are moved along the direction Y by means of a built-in linear motor mechanism in the Y-axis movable table 23. The first X-axis movable table 24A is outfitted with a first mounting head 25A as a work head by way of an X-axis movable attachment base, and the second X-axis movable table 24B is outfitted with a second mounting head 25B as a work head by way of the X-axis movable attachment base. The first mounting head 25A is actuated in the direction X by means of the built-in linear motor mechanism of the first X-axis movable table 24A, and the second mounting head 25B is actuated in the direction X by the built-in linear motor mechanism of the second X-axis movable table 24B. The Y-axis movable table 23, the first X-axis movable table 24A, and the second X-axis movable table 24B make up a head actuating mechanism for actuating the first mounting head 25A and the second mounting head 25B.

Each of the first mounting head 25A and the second mounting head 25B is configured such that a plurality of pickup nozzles 25a are removably attached to a lower portion of the mounting head, and the first mounting head 25A and the second mounting head 25B are actuated by the head actuating mechanism, thereby picking up electronic components from the respective tape feeders 29 with the pickup nozzles 25a, transferring and mounting the thus-picked-up electronic components on the respective substrates 4. The first mounting head 25A, the second mounting head 25B, and the head actuating mechanism make up component mounting mechanisms (a first component mounting mechanism and a second component mounting mechanism) that serve as a plurality of operation performance mechanisms for carrying out component mounting operations, which are component mounting operations, while taking as respective targets the plurality of substrates 4 conveyed by the first substrate conveyance mechanism 22A and the second substrate conveyance mechanism 22B.

A first component recognition camera 27A is interposed between the first substrate conveyance mechanism 22A and the tape feeders 29, and a second component recognition camera 27B is interposed between the second substrate conveyance mechanism 22B and the tape feeders 29. The first component recognition camera 27A is situated in a travel path of the first mounting head 25A and captures images of the electronic components held by the first mounting head 25A from below. The second component recognition camera 27B is situated in a travel path of the second mounting head 25B and captures images of the electronic components held by the second mounting head 25B from below. Imaging results are subjected to recognition processing, whereby positional deviations of the electronic components held by the first mounting head 25A and the second mounting head 25B are detected.

By reference to (a) and (b) in FIG. 5, a configuration and a function of the electronic component mounting apparatus M5* are now described. The electronic component mounting apparatus M5* is one that is embodied by providing the second component feed section 26B on one side of any of the electronic component mounting apparatuses M2 to M4 shown in (a) and (b) in FIG. 4 with, in place of the carriage 27 outfitted with the tape feeders 29, a tray feeder 30 that has a function of feeding trays 32 which store large electronic components. As shown in (b) in FIG. 5, the tray feeder 30 is outfitted with a tray housing section 31 that houses the plurality of trays 32 held by a palette (omitted from the drawing), and has a function of withdrawing each of the trays 32 from the tray housing section 31 with a tray holding section 33 and moving the thus-withdrawn tray 32 to a pickup position for the first mounting head 25A. During component mounting operation, the first mounting head 25A takes out electronic components from the tray 32 with the pickup nozzles 25a, transferring and mounting the thus-taken electronic components on the respective substrates 4 positioned and held by the substrate holding section 22a of the first substrate conveyance mechanism 22A and the substrate holding section 22a of the second substrate conveyance mechanism 22B. To be specific, the electronic component mounting apparatus M5* is configured such that the second component feeding section 26B corresponding to the second component mounting mechanism is equipped with the tray feeder 30. The electronic component mounting apparatus M5* is analogous to the electronic component mounting apparatuses M2 to M4 except the second component feeding section 26B in terms of the configuration and the function.

Figure 6:
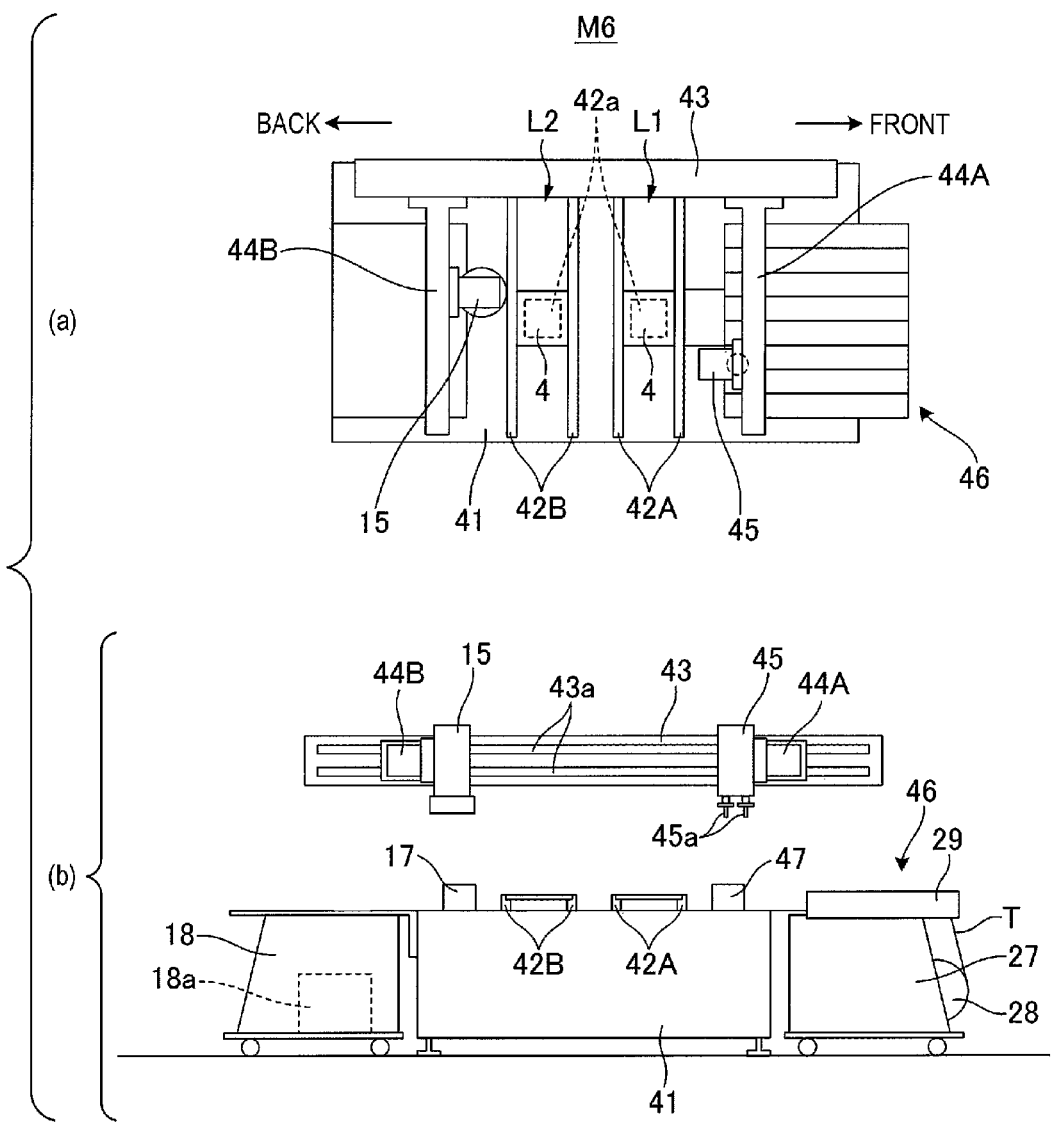
FIG. 6 is view in which (a) and (b) are explanatory views of a configuration of a mounting-inspecting apparatus in the electronic component mounting system of the embodiment of the invention.

By reference to (a) and (b) in FIG. 6, a configuration and a function of the mounting-inspecting apparatus M6 are now described. A first substrate conveyance mechanism 42A and the second substrate conveyance mechanism 42B are laid along the direction X at a center of a top surface of a bench 41. The first substrate conveyance mechanism 42A receives and conveys the substrate 4 on which the components are mounted and which is conveyed out from the first substrate conveyance mechanism 42A of the electronic component mounting apparatus M5*, and the second substrate conveyance mechanism 42B receives and conveys the substrate 4 on which the components are mounted and which is conveyed out from the second substrate conveyance mechanism 42B of the electronic component mounting apparatus M5*. Each of the first substrate conveyance mechanism 42A and the second substrate conveyance mechanism 42B has the substrate holding section 42a. The substrate holding section 42a positions and holds the conveyed substrate 4 at a operation position on the mounting-inspecting apparatus M6. The carriage 18 shown in (b) in FIG. 2 is placed on one side of the bench 41, and the carriage 27 shown in (b) in FIG. 4 is placed on the other side of the bench 41.

A Y-axis movable table 43 is placed along the direction Y at an end of the top surface of the bench 41 that is downstream in the direction X. The Y-axis movable table 43 is outfitted with a first X-axis movable table 44A and a second X-axis movable table 44B. The first X-axis movable table 44A and the second X-axis movable table 44B are slidable in the direction Y along guide rails 43a laid on a side surface of the Y-axis movable table 43 and are actuated along the direction Y by means of a built-in linear motor mechanism in the Y-axis movable table 43. The first X-axis movable table 44A is outfitted with a mounting head 45 as a work head by way of the X-axis movable attachment base, and the second X-axis movable table 44B is outfitted with the inspection head 15 as a work head by way of the X-axis movable attachment base. The mounting head 45 is actuated in the direction X by means of the built-in linear motor mechanism of the first X-axis movable table 44A, and the inspection head 15 is actuated in the direction X by the built-in linear motor mechanism of the second X-axis movable table 44B. The Y-axis movable table 43, the first X-axis movable table 44A, and the second X-axis movable table 44B make up the head actuating mechanism for actuating the mounting head 45 and the inspection head 15.

The mounting head 45 is configured such that a plurality of pickup nozzles 45a, are removably attached to a lower portion of the head. Like the first mounting head 25A and the second mounting head 25B in each of the electronic component mounting apparatuses M2 to M4, the mounting head 45 is actuated by the head actuating mechanism, thereby transferring and mounting the electronic components picked up from the tape feeders 29 to each of the respective substrates 4 that have been conveyed by the first substrate conveyance mechanism 42A and the second substrate conveyance mechanism 42B and that are positioned and held by the substrate holding sections 42a. The mounting head 45 and the foregoing head actuating mechanism make up a operation performance mechanism that subjects the plurality of substrates 4 conveyed by the first substrate conveyance mechanism 42A and the second substrate conveyance mechanism 42B to component mounting operations which are component mounting operations.

The inspection head 15 has functions analogous to those of the inspection head 15 shown in (a) and (b) in FIG. 2 and (a) to (c) in FIG. 3 and captures an image of each of the component-mounted substrates 4 conveyed by the first substrate conveyance mechanism 42A and the second substrate conveyance mechanism 42B. Imaging results are subjected to recognition processing by the recognition processing unit 18a, thereby performing a post-mounting inspection for determining whether or not a state of the electronic components mounted on the substrate 4 is non-defective. The inspection head 15 and the head actuating mechanism make up a operation performance mechanism that subjects the plurality of substrates 4 conveyed by the first substrate conveyance mechanism 42A and the second substrate conveyance mechanism 42B to substrate inspection operation which is a component mounting operation. The component-mounted substrate 4 having undergone the post-mounting inspection is conveyed into a reflow apparatus connected to a downstream-side of the operation performance mechanism, where the substrate 4 is heated to thereby solder the electronic components to circuit electrodes of the substrate 4.

In the configuration of the electronic component mounting system 1, a conveyance lane formed as a result of linkage of the first substrate conveyance mechanism 12A of the coating-inspecting apparatus M1, the first substrate conveyance mechanisms 22A of the respective electronic component mounting apparatuses M2 to M5*, and the first substrate conveyance mechanism 42A of the mounting-inspecting apparatus M6 and the respective operation performance mechanisms provided in correspondence with the conveyance lane make up the first mounting lane L1. Likewise, a conveyance lane formed as a result of linkage of the second substrate conveyance mechanism 12B of the coating-inspecting apparatus M1, the second substrate conveyance mechanisms 22B of the respective electronic component mounting apparatuses M2 to M5*, and the second substrate conveyance mechanism 42B of the mounting-inspecting apparatus M6 and the respective operation performance mechanisms provided in correspondence with the conveyance lane make up the second mounting lane L2.

In relation to the configuration of each of the coating-inspecting apparatus M1 to the mounting-inspecting apparatus M6 that are component mounting apparatuses of the embodiment, each of the apparatuses has a plurality of substrate conveyance mechanisms that have the substrate holding sections 12a, 22a, and 42a for conveying the substrates 4 received from an upstream apparatus in the substrate conveyance direction and positioning and holding the respective substrates 4 (the first substrate conveyance mechanisms 12A, 22A, and 42A and the second substrate conveyance mechanisms 12B, 22B, and 42B) and a plurality of operation performance mechanisms that are provided in correspondence with the respective substrate conveyance mechanisms and that take the substrate 4 held by the substrate holding sections 12a, 22a, and 42a as a target and subject the target to predetermined operation performance.

In relation to the above configuration, one operation performance mechanism is placed in correspondence with each of the two substrate conveyance mechanisms in any of the apparatuses. In the configuration of the operation performance mechanism, the work head can be moved to an elevated position above any one of the two substrate conveyance mechanisms by the Y-axis movable tables 13, 23, and 43 that are placed commonly to one pair of operation performance mechanisms. Accordingly, the substrate 4 that can be an operation target of each of the operation performance mechanisms is not always limited to the substrate 4 that is positioned and held by the substrate conveyance mechanism corresponding to the operation performance mechanism.

For these reasons, in the electronic component mounting system 1 shown in connection with the embodiment, the plurality of substrate conveyance mechanisms and the plurality of operation performance mechanisms are controlled by a operation control section 61 (FIG. 7) in each of the apparatuses, whereby any one of the two operation modes to be described below is selectively performed. To be specific, processing pertinent to a first operation mode (a so-called independent operation mode) and processing pertinent to a second operation mode (a so-called alternate operation mode) are selectively performed. In the first operation mode, only the substrate 4 held by the substrate holding sections 12a, 22a, and 42a of the substrate conveyance mechanisms corresponding to one operation performance mechanism is taken as a target, and the one operation performance mechanism subjects the target to operation performance independently for each mounting lane. In the second operation mode, all of the plurality of substrates 4 held by the substrate holding sections 12a, 22a, and 42a of the plurality of substrate conveyance mechanisms are taken as targets, and one operation performance mechanism subjects the targets to operation performance while alternately taking each of the mounting lanes as a operation target. A flexible production mode commensurate with a characteristic of a substrate type to be produced and the number of production lots can thereby be selected.

Figure 7:
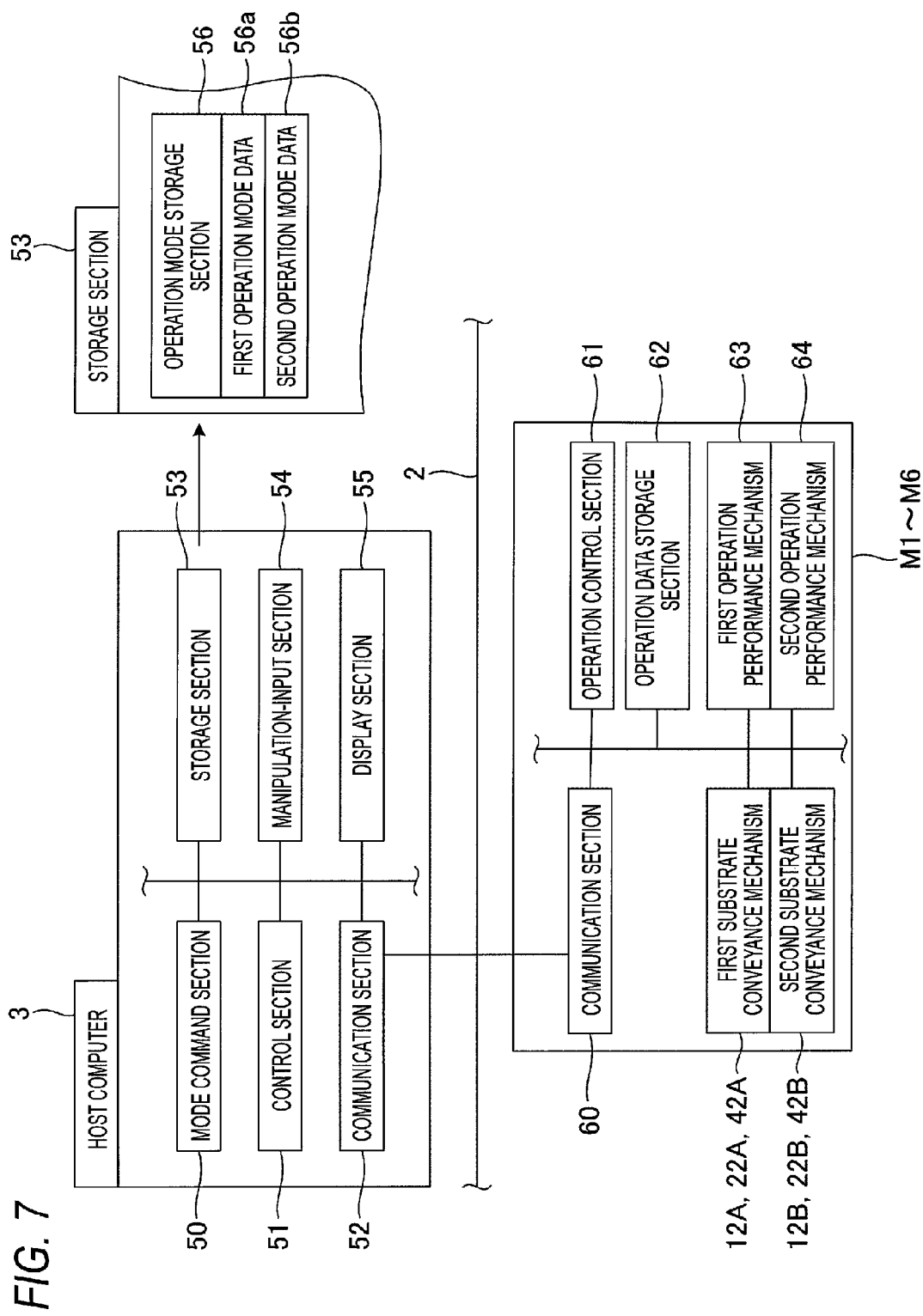
FIG. 7 is a block diagram showing a configuration of a control system of the electronic component mounting system of the embodiment of the invention.

Next, a configuration of the control system of the electronic component mounting system 1 is described by reference to FIG. 7. In FIG. 7, the host computer 3 is equipped with a mode command section 50, a control section 51, a communication section 52, a storage section 53, a manipulation-input section 54, and a display section 55. The mode command section 50 sends a command of a operation mode to be selectively executed to each of the component mounting apparatuses that make up the electronic component mounting system 1; namely, the coating-inspecting apparatus M1 to the mounting-inspecting apparatus M6. Specifically, a mode command is sent from the mode command section 50 by way of the LAN system 2, whereby each of the coating-inspecting apparatus M1 to the mounting-inspecting apparatus M6 carries out operation performance according to a specified operation mode. The control section 51 collectively controls the operation performance to be carried out by each of the apparatuses that make up the electronic component mounting system 1.

By way of the LAN system 2, the communication section 52 exchanges a signal with respect to the coating-inspecting apparatus M1 to the mounting-inspecting apparatus M6 that make up the electronic component mounting system 1. In connection with a type of a substrate to be a target in each of the apparatuses of the electronic component mounting system 1, the storage section 53 stores information about the operation mode as well as operation data and operation programs required to carry out operation performance; namely, data and programs used for performing an inspection, resin coating, component mounting, and a post-mount inspection for the substrate. To be specific, the storage section 53 includes a operation mode storage section 56, and the operation mode storage section 56 storages first operation mode data 56a for performing processing pertinent to the first operation mode and second operation mode data 56b for performing processing pertinent to the second operation mode.

The manipulation-input section 54 is an input device, like a touch panel, and a line manager who manages the electronic component mounting system 1 inputs various manipulation commands by way of the manipulation-input section 54. The manipulation command includes a command of the operation mode. Namely, the mode command section 50 issues a command of a operation mode as a result of the line manager entering a operation mode command by way of the manipulation-input section 54. The display section 55 is a display panel, like a liquid crystal panel, and displays a guide screen at the time of inputting of a manipulation command and a command of a tool change operation required when a type of a substrate is changed.

A control system of the coating-inspecting apparatus M1 to the mounting-inspecting apparatus M6 is now described. Each of the coating-inspecting apparatus M1 to the mounting-inspecting apparatus M6 has a communication section 60, the operation control section 61, and a operation data storage section 62. The communication section 60 is connected to the LAN system 2, and the coating-inspecting apparatus M1 to the mounting-inspecting apparatus M6 send and receive signals and data to and from the host computer 3. Of operation data stored in the storage section 53 of the host computer 3, operation data and operation programs that are required to carry out operation performance to be executed by the apparatus are written into the operation data storage section 62.

In accordance with a mode command signal issued from the mode command section 50 of the host computer 3 by way of the LAN system 2, the operation control section 61 controls the first substrate conveyance mechanisms 12A, 22A, and 42A, the second substrate conveyance mechanisms 12B, 22B, and 42B, a first operation performance mechanism 63, and a second operation performance mechanism 64 by reference to operation data stored in the operation data storage section 62. The first operation performance mechanism 63 and the second operation performance mechanism 64 are operation performance mechanisms concomitant to the first mounting lane L1 and the second mounting lane L2, respectively. Each of the coating-inspecting apparatus M1 to the mounting-inspecting apparatus M6 thereby carries out operation performance based on the first operation mode data 56a and the second operation mode data 56b commanded by the host computer 3.

The electronic component mounting system 1 is configured as above, and an electronic component mounting method to be performed by the electronic component mounting system 1 is now described. As mentioned above, since the electronic component mounting system 1 described in connection with the embodiment is configured with a view toward realizing a more flexible production mode, several variations are appropriately adopted in accordance with a production target in a scene of real application. By reference to (a) in FIG. 8 to (c) in FIG. 11, the variations are described by taking three types of embodiments.

Figure 8:
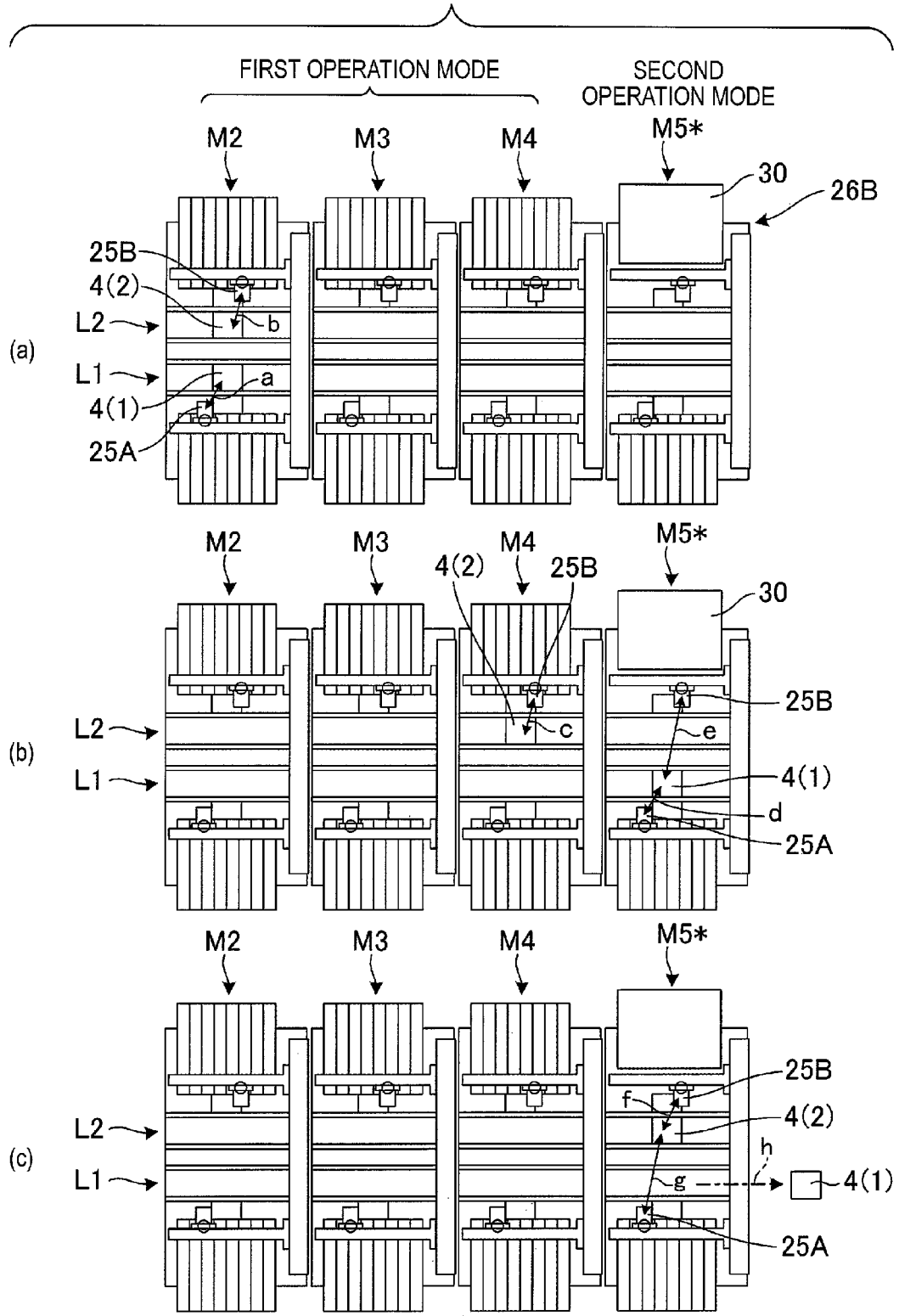
FIG. 8 is view in which (a) to (c) are explanatory views of steps of an electronic component mounting method of the embodiment of the invention.

First, a first embodiment shown in (a) to (c) in FIG. 8 shows an example in which the electronic component mounting system 1 is made up of the four electronic component mounting apparatuses M2, M3, M4, and M5* without employment of the coating-inspecting apparatus M1. As shown in (a) and (b) in FIG. 4, the electronic component mounting apparatuses M2, M3, and M4 correspond to a type of electronic component mounting apparatus in which each of the first component feed section 26A and the second component feed section 26B is equipped with the tape feeders 29. Further, as shown in (a) and (b) in FIG. 5, the electronic component mounting apparatus M5* is a type of electronic component mounting apparatus in which the second component feed section 26B on one side is outfitted with the tray feeder 30. To be specific, in the first embodiment, at least one of the component mounting apparatuses that make up the electronic component mounting system 1 serves as an electronic component mounting apparatus that mounts electronic components, which are picked up from the tray feeder 30, to the substrate 4 by means of a mounting head of the component mounting mechanism that acts as the operation performance mechanism.

Under the electronic component mounting method implemented by the electronic component mounting system 1 with such a configuration, the mode command section 50 of the host computer 3 first sends the second operation mode, as a operation mode to be selectively executed, to the electronic component mounting apparatus M5* and the first operation mode to the other electronic component mounting apparatuses M2, M3, and M4. When a component mounting operation is commenced, the electronic component mounting apparatus M2 situated at the most upstream position performs a component mounting operation conforming to the first operation mode as shown in (a) in FIG. 8. There is provided an example case where the substrates 4 are fed respectively to the first mounting lane L1 and the second mounting lane L2 with a time lag.

Specifically, a substrate 4(1) that is a preceding substrate is first carried into the first mounting lane L1 of the electronic component mounting apparatus M2, and the first mounting head 25A of the first component mounting mechanism provided in the electronic component mounting apparatus M2 performs a component mounting operation intended for the substrate 4(1) (as designated by arrow "a"). A substrate 4(2) that is a subsequent substrate is then carried into the second mounting lane L2 independently of the component mounting operation of the first mounting lane L1, and the second mounting head 25B of the second component mounting mechanism performs a component mounting operation intended for the substrate 4(2) (as designated by arrow "b"). The substrate 4(1) and the substrate 4(2) that have finished undergoing the component mounting operation performed by the electronic component mounting apparatus M2 are sequentially delivered to the electronic component mounting apparatuses M3 and M4 located downstream positions. Likewise, the electronic component mounting apparatuses M3 and M4 also carry out the component mounting operation conforming to the first operation mode.

(b) in FIG. 8 shows that the substrate 4(1) that has first finished undergoing the component mounting operation performed by the electronic component mounting apparatus M4 is carried into the electronic component mounting apparatus M5* and that the substrate 4(2) that is a subsequent substrate still stays and keeps undergoing a operation performed by the electronic component mounting apparatus M4. Specifically, the second mounting head 25B of the second component mounting mechanism performs a component mounting operation intended for the substrate 4(2) in the second mounting lane L2 of the electronic component mounting apparatus M4 (as designated by arrow "c"). The first mounting head 25A of the first component mounting mechanism performs a component mounting operation intended for the substrate 4(1) in the first mounting lane L1 of the electronic component mounting apparatus M5* (as designated by arrow "d"). The component mounting operation alternates with another component mounting operation for mounting the electronic components picked up from the tray feeder 30 with the second mounting head 25B of the second component mounting mechanism on the substrate 4(1) (as designated by arrow "e").

As shown in (c) in FIG. 8, the substrate 4(1) that has finished undergoing the component mounting operation and the inspection processing operation performed by the electronic component mounting apparatus M5* is carried out in the downstream direction (as designated by arrow "h"). The substrate 4(2) that has finished undergoing the component mounting operation performed by the electronic component mounting apparatus M4 is carried into the electronic component mounting apparatus M5*. The first mounting head 25A of the first component mounting mechanism performs the component mounting operation intended for the substrate 4(1) on the second mounting lane L2 of the electronic component mounting apparatus M5* (as designated by arrow "g"). The component mounting operation alternates with another component mounting operation for mounting the electronic components picked up from the tray feeder 30 with the second mounting head 25B of the second component mounting mechanism on the substrate 4(2) (as designated by arrow "f").

Figure 9:
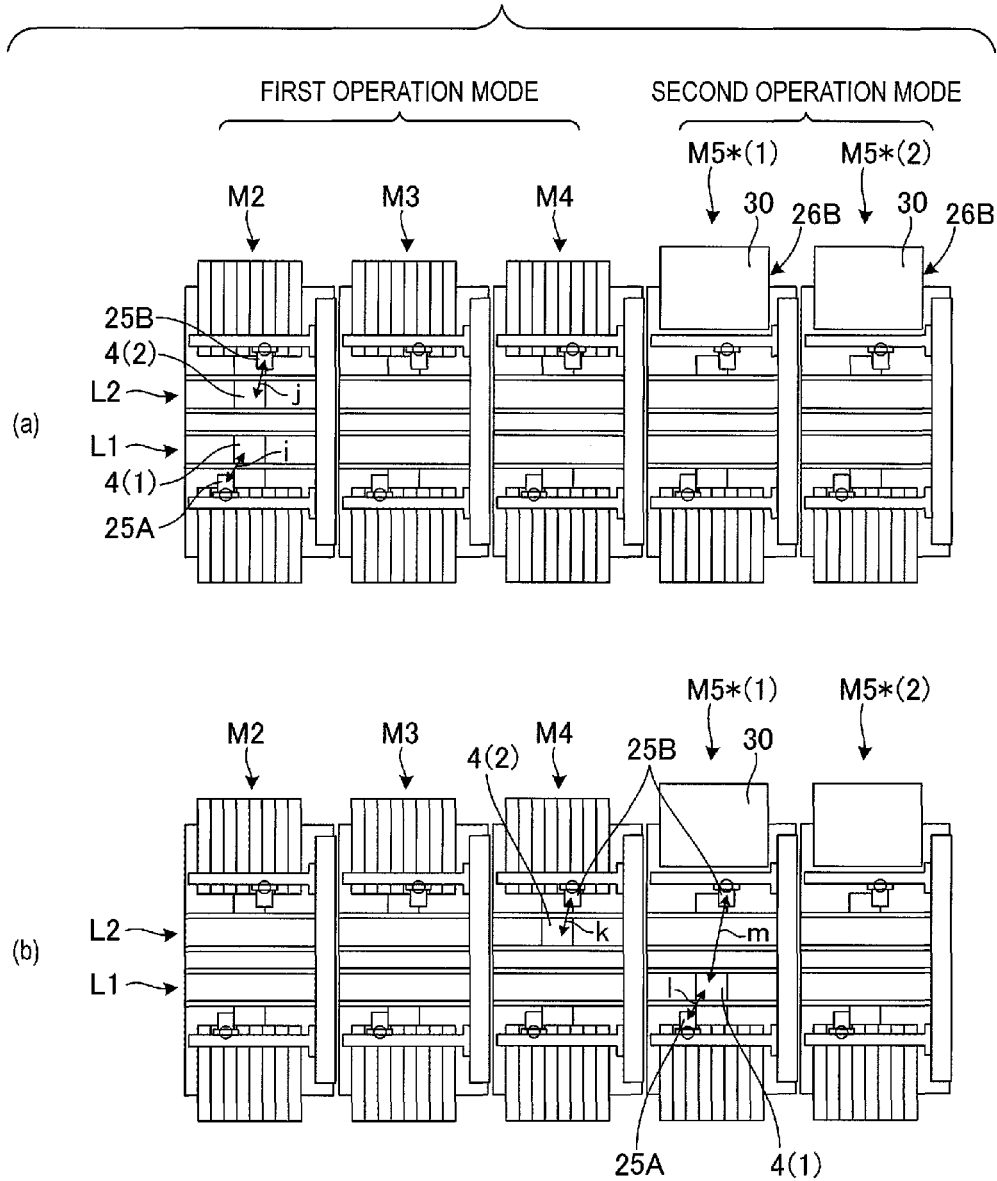
FIG. 9 is view in which (a) and (b) are explanatory views of steps of an electronic component mounting method of the embodiment of the invention.
Figure 10:
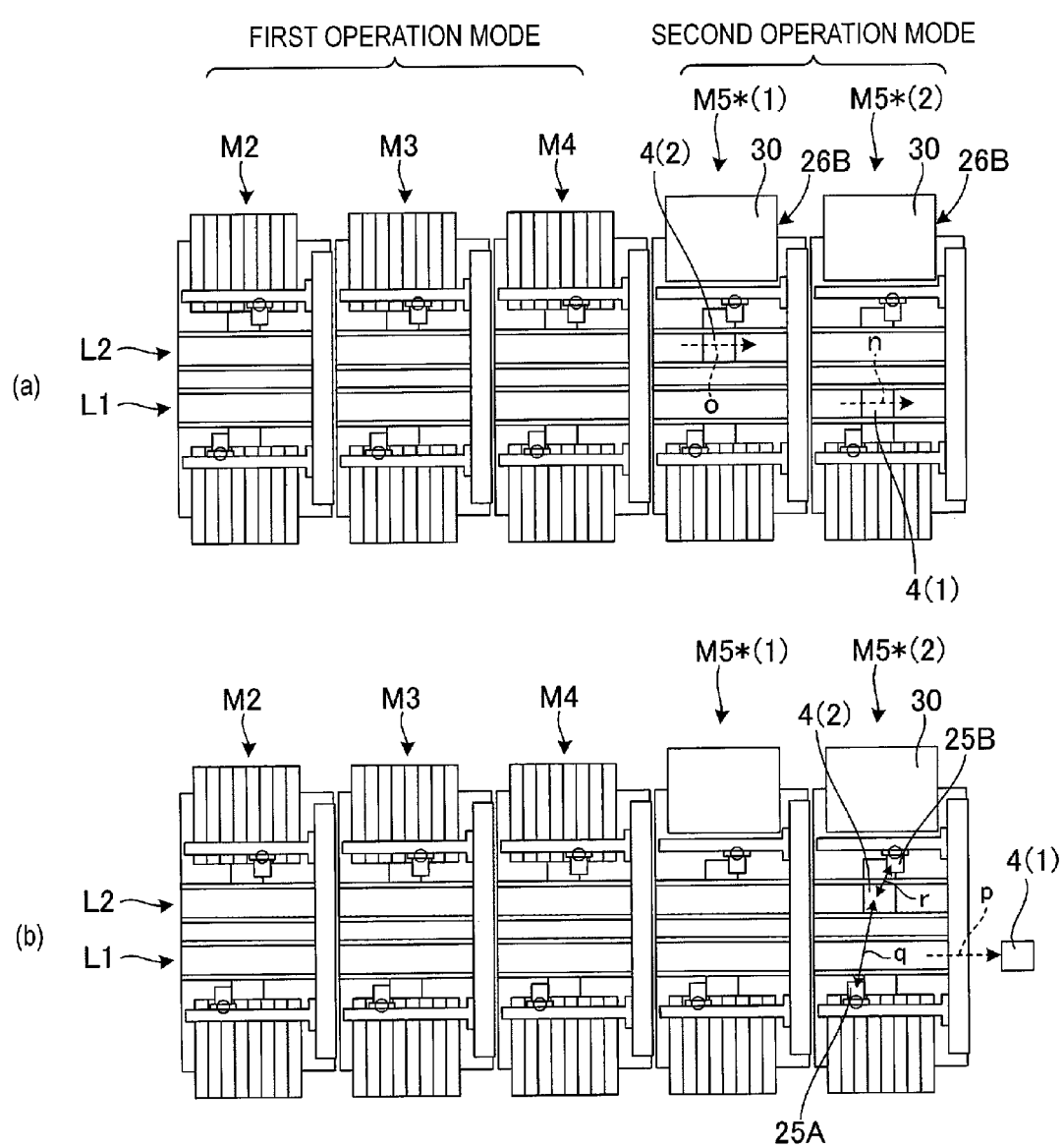
FIG. 10 is view in which (a) and (b) are explanatory views of the steps of the electronic component mounting method of the embodiment of the invention.

A second embodiment shown in (a) and (b) in FIG. 9 and (a) and (b) in FIG. 10 represents a configuration in which two electronic component mounting apparatuses M5* (electronic component mounting apparatuses M5*(1) and M5*(2) arranged in this sequence from an upstream side) are linked together despite only one electronic component mounting apparatus M5* employed in the embodiment shown in (a) to (c) in FIG. 8. In this regard, when a larger number of electronic component mounting apparatuses are linked together, a much larger number of electronic component mounting apparatuses M5* may be required. To be specific, in the second embodiment, at least two of the component mounting apparatuses that make up the electronic component mounting system 1 act as electronic component mounting apparatuses that mount electronic components picked up from the tray feeder 30 on the substrate 4 by means of the mounting heads of the component mounting mechanisms which serve as the operation performance mechanisms.

The tray feeder 30 is placed in the second component feed sections 26B of the two electronic component mounting apparatuses M5*(1) and M5*(2), being concentrated in an area of the second substrate conveyance mechanism. As a matter of course, if a layout permits, there will be no problem in adopting another configuration in which the tray feeders 30 are placed in the first component feed sections 26A of the electronic component mounting apparatuses M5*(1) and M5*(2), being concentrated in areas of the first conveyance mechanism. The essential requirement for this is that the tray feeders be concentrated in areas of either the first substrate conveyance mechanism or the second substrate conveyance mechanism. The tray feeder 30 occupying a space larger than that of the component feed section equipped with an ordinary tape feeder is thereby placed only on one side. Thereby, preventing an increase in area occupied by the mounting lines which would otherwise be caused when the tray feeders 30 jut out of both sides of the conveyance mechanisms.

Under the electronic component mounting method implemented by the electronic component mounting system 1 with such a configuration, the mode command section 50 of the host computer 3 first sends the second operation mode as a operation mode to be selectively carried out to the two electronic component mounting apparatuses M5*(1) and M5*(2), sending the first operation mode to the other electronic component mounting apparatuses M2, M3, and M4 as in the case with the first embodiment. In this respect, control commands are issued such that, of the two electronic component mounting apparatuses M5*, the upstream electronic component mounting apparatus M5*(1) carries out a component mounting operation conforming to the second operation mode while taking as a target the first mounting lane L1; namely, the substrate 4 held by the substrate holding section 22a (see (a) in FIG. 5) of the first substrate conveyance mechanism 22A; and that the electronic component mounting apparatus M5*(2) carries out the component mounting operation conforming to the second operation mode while taking, as a target, the substrate 4 held by the substrate holding section 22a (see (a) in FIG. 5) of the second substrate conveyance mechanism 22B.

As shown in (a) in FIG. 9, when the component mounting operation is commenced, the electronic component mounting apparatus M2 located at the uppermost stream position performs the component mounting operation conforming to the first operation mode. As in the case with the embodiment shown in (a) in FIG. 8, an illustration shows a case where the substrates 4 are fed to the first mounting lane L1 and the second mounting lane L2 with a time lag. To be specific, the substrate 4(1) which is a preceding substrate is first carried into the first mounting lane L1 of the electronic component mounting apparatus M2, and the first mount head 25A of the first component mounting mechanism provided on the electronic component mounting apparatus M2 carries out a component mounting operation intended for the substrate 4(1) (as designated by arrow "i").

Next, the substrate 4(2) which is a subsequent substrate is carried into the second mounting lane L2 independently of the component mounting operation of the first mounting lane L1, and the second mounting head 25B of the second component mounting mechanism performs a component mounting operation intended for the substrate 4(2) (as designated by arrow "j"). The substrate 4(1) and the substrate 4(2) that have finished undergoing the component mounting operation performed by the electronic component mounting apparatus M2 are sequentially delivered to the electronic component mounting apparatuses M3 and M4 located downstream positions. Likewise, the electronic component mounting apparatuses M3 and M4 also carry out the component mounting operation conforming to the first operation mode.

(b) in FIG. 9 shows that the substrate 4(1) that has first finished undergoing the component mounting operation performed by the electronic component mounting apparatus M4 is carried into the electronic component mounting apparatus M5*(1) and that the substrate 4(2) that is a subsequent substrate still stays and keeps undergoing a operation performed by the electronic component mounting apparatus M4. Specifically, the second mounting head 25B of the second component mounting mechanism performs a component mounting operation intended for the substrate 4(2) in the second mounting lane L2 of the electronic component mounting apparatus M4 (as designated by arrow "k"). The first mounting head 25A of the first component mounting mechanism performs a component mounting operation intended for the substrate 4(1) in the first mounting lane L1 of the electronic component mounting apparatus M5*(1) (as designated by arrow "l"). The component mounting operation alternates with another component mounting operation for mounting the electronic components picked up from the tray feeder 30 with the second mounting head 25B of the second component mounting mechanism on the substrate 4(1) (as designated by arrow "m").

As shown in (a) in FIG. 10, the substrate 4(1) that has finished undergoing the component mounting operation and the inspection processing operation performed by the electronic component mounting apparatus M5*(1) is conveyed in a downstream direction and carried in the electronic component mounting apparatus M5*(2). However, the electronic component mounting apparatus M5*(2) is set so as to take only the second mounting lane L2 as a operation target in the second operation mode. Hence, the substrate 4(1) conveyed by the first mounting lane L1 passes on the electronic component mounting apparatus M5*(2) (as designated by arrow "n"). The substrate 4(2) that has finished undergoing the component mounting operation performed by the electronic component mounting apparatus M4 is conveyed downstream, being carried into the electronic component mounting apparatus M5*(1).

Since the electronic component mounting apparatus M5*(1) is set so as to take only the first mounting lane L1 as a operation target in the second operation mode, the substrate 4(2) conveyed by the second mounting lane L2 passes on the electronic component mounting apparatus M5*(1) in the same way (as designated by arrow "o").

As shown in (b) in FIG. 10, the substrate 4(1) passed on the electronic component mounting apparatus M5*(2) is subsequently conveyed downstream (as designated by arrow "p"). The substrate 4(2) passed on the electronic component mounting apparatus M5*(1) is carried in the electronic component mounting apparatus M5*(2). The first mounting head 25A of the first component mounting mechanism performs a component mounting operation intended for the substrate 4(2) in the second mounting lane L2 of the electronic component mounting apparatus M5*(2) (as designated by arrow "q"). The component mounting operation alternates with another component mounting operation for mounting the electronic components picked up from the tray feeder 30 with the second mounting head 25B of the second component mounting mechanism on the substrate 4(2) (as designated by arrow "r"). After the electronic component mounting apparatus M5*(2) has finished performing a component mounting operation intended for the substrate 4(2), the substrate 4(2) is conveyed downstream in the same manner.

As above, there is adopted a line configuration in which the electronic component mounting apparatus M5* equipped with the tray feeder 30 for alternate mounting purpose is provided for each mounting lane, whereby tray components picked out from another tray feeder 30 can be mounted on the other mounting lane even when the electronic component mounting apparatus 5* of one mounting lane is in the middle of carrying out a type switching operation, such as tray replacement, of the tray feeder 30.

Figure 1:
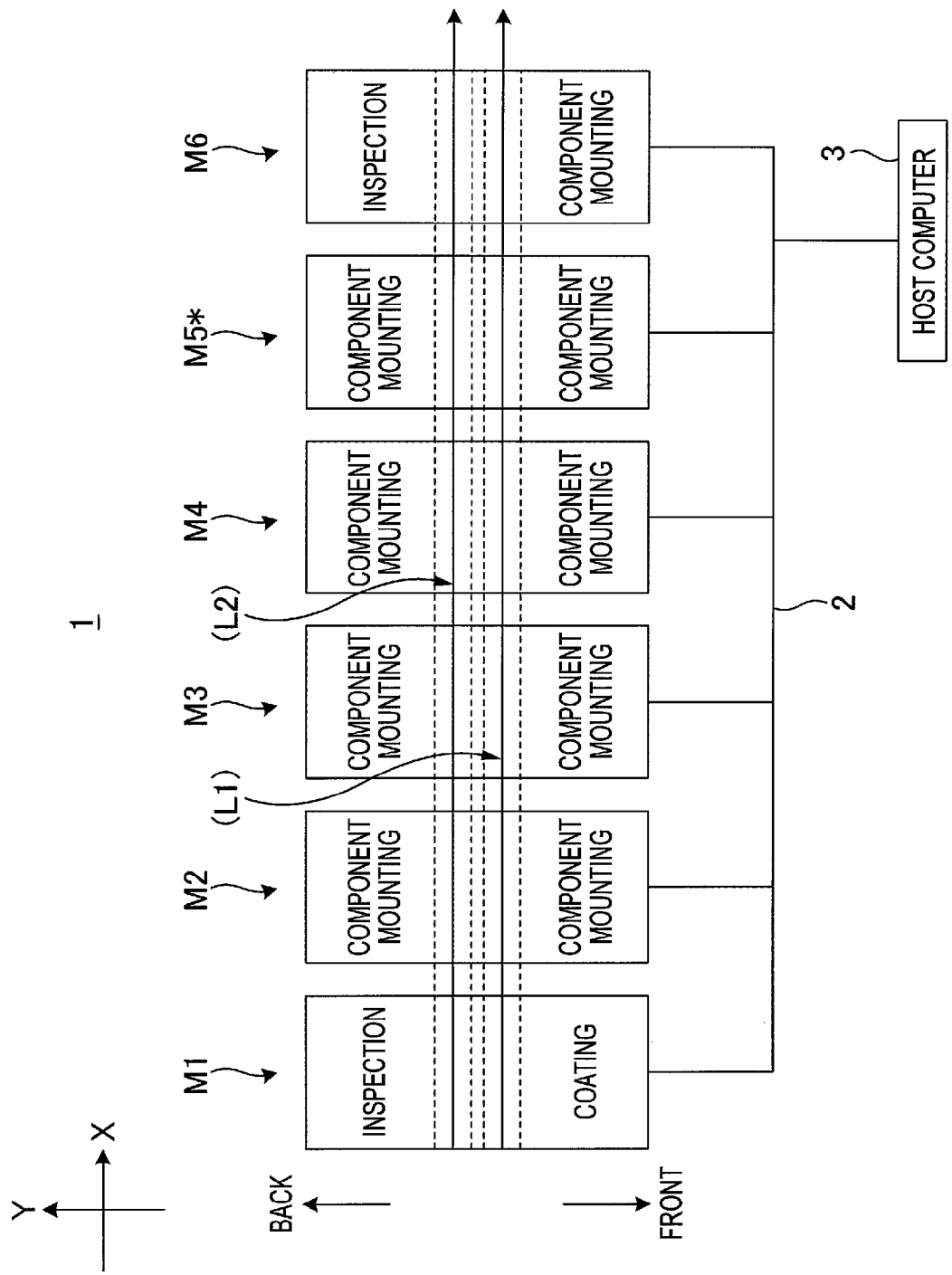
FIG. 1 is an explanatory view of a configuration of an electronic component mounting system of an embodiment of the invention.
Figure 11:
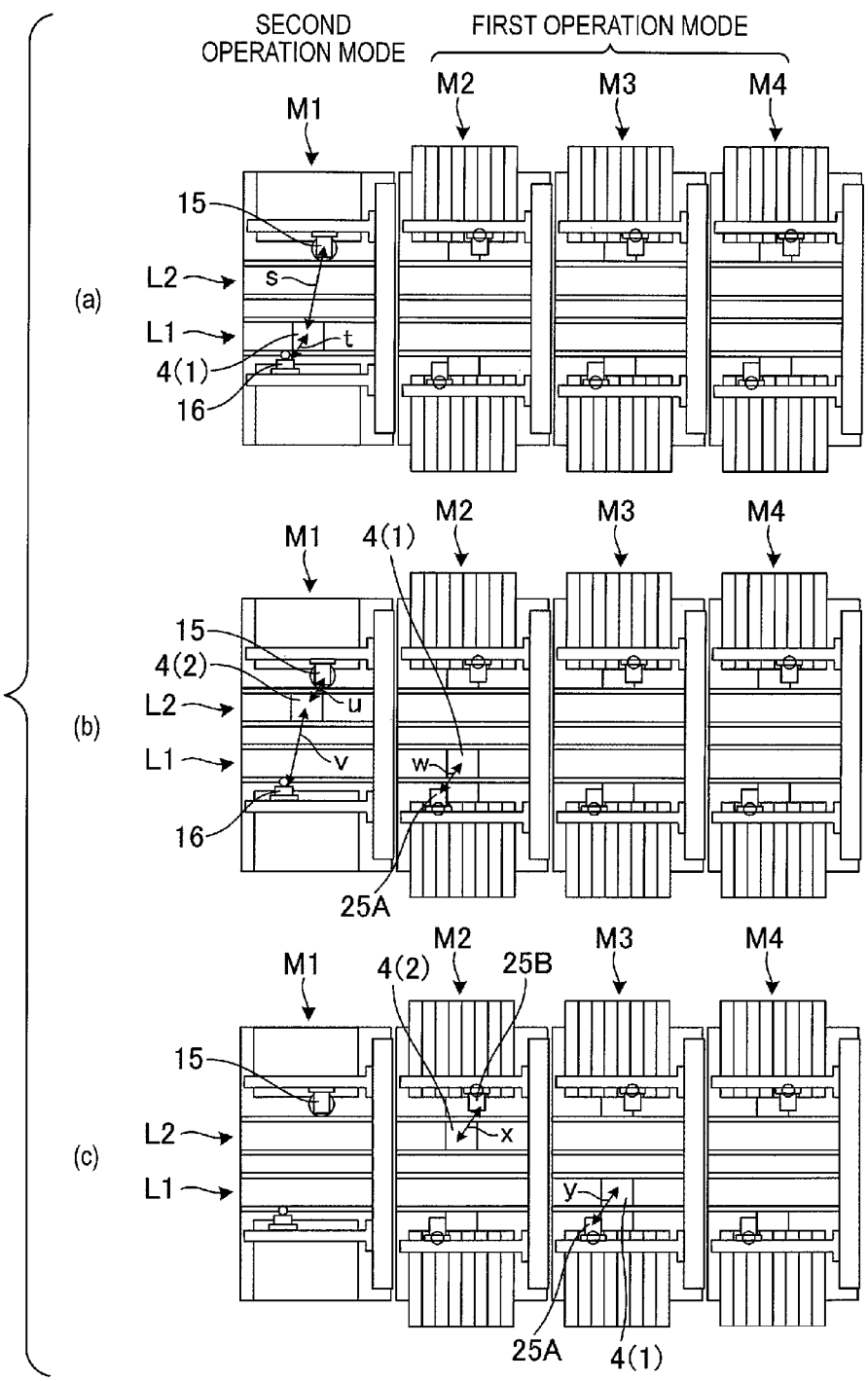
FIG. 11 is view in which (a) to (c) are explanatory views of steps of an electronic component mounting method of the embodiment of the invention.

A third embodiment shown in (a) to (c) in FIG. 11 represents an example in which the electronic component mounting system 1 is made up of the coating-inspecting apparatus M1 and the electronic component mounting apparatuses M2, M3, and M4 in the apparatus layout shown in FIG. 1. In the coating-inspecting apparatus M1, the resin coating mechanism outfitted with the coating head 16 is provided in the first mounting lane L1, and the inspection processing mechanism equipped with the inspection head 15 is provided in the second mounting lane L2 (see (a) and (b) in FIG. 2). Moreover, each of the electronic component mounting apparatuses M2, M3, and M4 is an electronic component mounting apparatus in which both the first component feed section 26A and the second component feed section 26B are outfitted with the tape feeders 29 (see (a) and (b) in FIG. 4). Specifically, in the first embodiment, at least one of the component mounting apparatuses that makes up the electronic component mounting system 1 serves as either an inspecting apparatus that is a operation performance mechanism and that captures an image of the substrate 4 with the inspection head 15 of the substrate inspection mechanism and performs a predetermined inspection or a resin coating apparatus that also serves as a operation performance mechanism and that coats the substrate 4 with the resin adhesive 19 for bonding electronic components by means of the coating head 16 of the resin coating mechanism. The embodiment shows an example of use of the coating-inspecting apparatus M1 that exhibits both the function of the inspecting apparatus and the resin coating apparatus.

Under the electronic component mounting method implemented by the electronic component mounting system 1 with such a configuration, the mode command section 50 of the host computer 3 first sends the second operation mode, as a operation mode to be selectively executed, to the coating-inspecting apparatus M1, sending the first operation mode to the other electronic component mounting apparatuses M2, M3, and M4. When the component mounting operation is commenced, the coating-inspecting apparatus M1 situated at the uppermost stream position performs a operation performance conforming to the second operation mode as shown in (a) in FIG. 11. There is provided an example case where the substrates 4 are fed respectively to the first mounting lane L1 and the second mounting lane L2 with a time lag.

Specifically, the substrate 4(1) that is a preceding substrate is first carried into the first mounting lane L1 of the coating-inspecting apparatus M1, and the mounting head 15 of the inspection processing mechanism provided in the coating-inspecting apparatus M1 performs a component mounting operation intended for the substrate 4(1) (as designated by arrow "s"). The coating head 16 of the resin coating mechanism alternately performs a resin coating operation and a substrate inspection operation for the single substrate 4(1) (as designated by arrow "t"). Subsequently, as shown in (b) in FIG. 11, the substrate 4(2) that is a subsequent substrate is carried into the second mounting lane L2 of the coating-inspecting apparatus M1. Likewise, a operation performance conforming to the second work mode is carried out. First, the inspection head 15 of the inspection processing mechanism provided in the coating-inspecting apparatus M1 performs a substrate inspection operation intended for the substrate 4(2) (as designated by arrow "u"). Next, the inspection head 16 of the inspection processing mechanism provided in the coating-inspecting apparatus M1 performs a substrate inspection operation intended for the substrate 4(1) (as designated by arrow "v").

The substrate 4(1) that has finished undergoing resin coating and inspection processing performed by the coating-inspecting apparatus M1 on the first mounting lane L1 is carried into the electronic component mounting apparatus M2. The component mounting operation conforming to the first operation mode is carried out for the substrate 4(1). Specifically, the first mounting head 25A of the first component mounting mechanism carries out a component mounting operation intended for the substrate 4(1) (designated by arrow "w"). As shown in FIG. 11(c), the substrate 4(2) that has finished undergoing resin coating and inspection processing performed by the coating-inspecting apparatus M1 on the second mounting lane L2 is carried into the electronic component mounting apparatus M2, where the second mounting head 25B of the second component mounting mechanism carries out a component mounting operation intended for the substrate 4(2) (designated by arrow "x"). At this time, the substrate 4(1) that has finished undergoing the component mounting operation performed by the electronic component mounting apparatus M2 on the first mounting lane L1 is already carried in the electronic component mounting apparatus M3, where the first mounting head 25A of the first component mounting mechanism performs a component mounting operation intended for the substrate 4(1) (as designated by arrow "y"). In subsequent operation, the component mounting operation conforming to the first operation mode is sequentially carried out while taking as targets the substrates 4(1) and 4(2) conveyed to the respective downstream apparatuses.

Although mention is not made of the configuration including the mounting-inspecting apparatus M6 in the three embodiments, the second operation mode can be applied even to the mounting-inspecting apparatus M6 as in the case with the coating-inspecting apparatus M1 descried in connection with the third embodiment, because the mounting-inspecting apparatus M6 varies from the first mounting lane L1 to the second mounting lane as in the case with the coating-inspecting apparatus M1 in terms of the configuration of the operation performance mechanism.

As above, the invention is directed to the electronic component mounting system 1 in which a plurality of component mounting apparatuses outfitted with the plurality of mounting lanes are linked together and which is configured so as to selectively perform processing pertinent to either one of two operation modes; namely, the first operation mode of letting one operation performance mechanism carry out operation performance while taking as a target only the substrate held by the substrate holding section of the substrate conveyance mechanism corresponding to the operation performance mechanism and the second operation mode in which one operation performance mechanism can carry out operation performance while taking as targets all a plurality of substrates held by the substrate holding sections of a plurality of substrate conveyance mechanisms. This makes it possible to select an appropriate one from various mounting operation modes in accordance with a characteristic of a type of a substrate to be produced, whereby an electronic component mounting system and an electronic component mounting method that exhibit superior flexibility and production efficiency can be materialized.

Although the invention has been described in detail and by reference to the specific embodiments thus far, it is manifest to those who are skilled in the art that various alterations and corrections can be made to the invention without departing the spirit and scope of the invention.

The invention is based on Japanese Patent Application (JP-2010-274300) filed on Dec. 9, 2010, the subject matter of which is incorporated herein by reference in its entirety.

INDUSTRIAL APPLICABILITY

The electronic component mounting system and the electronic component mounting method of the invention make it possible to select an appropriate one from a variety of mounting operation modes in accordance with a characteristic of a type of a production target, yield an advantage of flexibility and superior production efficiency, and are useful in an electronic component mounting field where a mounted substrate is manufactured by mounting electronic components on a substrate.

DESCRIPTIONS OF THE REFERENCE NUMERALS AND SYMBOLS 1 electronic component mounting system
2 LAN system
12A, 22A, 42A first substrate conveyance mechanism
12B, 22B, 42B second substrate conveyance mechanism
12a, 22a, 42a substrate holding section
15 inspection head
16 coating head
25A first mounting head
25B second mounting head
26A first component feed section
26B second component feed section
29 tape feeder
30 tray feeder
45 mounting head
M1 coating-inspecting apparatus
M2, M3, M4, M5* electronic component mounting apparatus
M6 mounting-inspecting apparatus
L1 first mounting lane
L2 second mounting lane

The invention claimed is:

1. An electronic component mounting system configured by joining a plurality of component mounting apparatuses that perform component mounting operations for mounting electronic components on substrates, wherein each of the component mounting apparatuses has:

a first substrate conveyance mechanism and a second substrate conveyance mechanism that convey substrates received from an upstream apparatuses in a substrate conveyance direction and that each has a substrate holding section for positioning and holding the substrate, a first operation performance mechanism and a second operation performance mechanism that are provided in correspondence to the first substrate conveyance mechanism and the second substrate conveyance mechanism and that perform predetermined operation performance while taking the substrates held by the substrate holding sections as targets, an operation control section that selects any one of two modes of a first operation mode and a second operation mode and controls the first substrate conveyance mechanism, the second substrate conveyance mechanism, the first operation performance mechanism, and the second operation performance mechanism to perform the selected mode, the first operation mode letting one operation performance mechanism carry out operation performance while taking as a target only a substrate held by the substrate holding section of a substrate conveyance mechanism corresponding to the operation performance mechanism, the second operation mode in which one operation performance mechanism can carry out operation performance while taking as targets two substrates held by the substrate holding section of the substrate conveyance mechanism and the substrate holding section of the other substrate conveyance mechanism;

wherein the electronic component mounting system comprises a mode command section for commanding the operation mode to be selectively carried out in each of the component mounting apparatuses to the respective component mounting apparatuses;

at least two of the component mounting apparatuses are electronic component mounting apparatuses that mount on the substrates electronic components picked up from a tray feeder by a mounting head of a component mounting mechanism that serves as the operation performance mechanism; and the mode command section sends the second operation mode as an operation mode to be selectively carried out to at least the two electronic component mounting apparatuses, and one of the tray feeders of at least the two electronic component mounting apparatuses is used in a component mounting operation intended for a substrate held by the substrate holding section of the first substrate conveyance mechanism, and the other tray feeder is used in a component mounting operation intended for a substrate held by the substrate holding section of the second substrate conveyance mechanism.

2. The electronic component mounting system according to claim 1, wherein the tray feeders are placed only on one side from either the first substrate conveyance mechanism or the second substrate conveyance mechanism.

* * * * *